United States Patent
Smith et al.

(10) Patent No.: US 7,806,994 B2
(45) Date of Patent: Oct. 5, 2010

(54) ELECTRONIC PACKAGE FORMED USING LOW-TEMPERATURE ACTIVE SOLDER INCLUDING INDIUM, BISMUTH, AND/OR CADMIUM

(75) Inventors: Ronald W. Smith, Blue Bell, PA (US); Randall Redd, Phoenixville, PA (US)

(73) Assignee: S-Bond Technologies, LLC, Lansdale, PA (US)

( * ) Notice: Subject to any disclaimer, the term of this patent is extended or adjusted under 35 U.S.C. 154(b) by 234 days.

(21) Appl. No.: 11/579,413

(22) PCT Filed: May 4, 2005

(86) PCT No.: PCT/US2005/015534

§ 371 (c)(1),
(2), (4) Date: Nov. 2, 2006

(87) PCT Pub. No.: WO2005/122252

PCT Pub. Date: Dec. 22, 2005

(65) Prior Publication Data

US 2007/0228109 A1    Oct. 4, 2007

Related U.S. Application Data

(60) Provisional application No. 60/568,037, filed on May 4, 2004, provisional application No. 60/643,640, filed on Jan. 13, 2005.

(51) Int. Cl.
*C22C 13/00* (2006.01)

(52) U.S. Cl. ................... 148/400; 420/555; 420/557; 420/562

(58) Field of Classification Search ............. 420/555, 420/557, 562; 148/400
See application file for complete search history.

(56) References Cited

U.S. PATENT DOCUMENTS 3,949,118 A    4/1976   Nagano et al.

(Continued)

FOREIGN PATENT DOCUMENTS

AT    193612    11/1957

(Continued)

OTHER PUBLICATIONS

Humpston, Giles et al., Principles of Soldering and Brazing, 1993, ASM International, pp. 38, 52, 53, 66, 67 and 167.

(Continued)

*Primary Examiner*—Sikyin Ip
(74) *Attorney, Agent, or Firm*—Stradley Ronon Stevens & Young, LLP

(57) ABSTRACT

An active solder alloy, an electronic device package including the active solder alloy bonding an electronic device to a substrate, and a method of forming high-strength joints by soldering using the solder alloy. The alloy contains up to about 10% by weight of an element or a mixture of elements selected from the group consisting of titanium, zirconium, hafnium, vanadium, niobium, or tantalum; between about 0.1 and 5% by weight of an element or a mixture of elements selected from the group of the lanthanides (rare earths); between about 0.01 and 1% by weight of gallium up to about 10% by weight of silver; up to about 2% by weight of magnesium; and a remainder consisting of tin, bismuth, indium, cadmium, or a mixture of two or more of these elements. The alloy enables low-temperature (less than about 180° C.) soldering within relatively narrow melting ranges (less than about 10° C.).

10 Claims, 1 Drawing Sheet

U.S. PATENT DOCUMENTS

| | | | |
|---|---|---|---|
| 4,040,822 A | 8/1977 | Stern | |
| 4,106,930 A | 8/1978 | Nomaki et al. | |
| 4,451,541 A | 5/1984 | Beal | |
| 4,643,875 A | 2/1987 | Mizuhara | |
| 4,785,989 A | 11/1988 | Mizuhara et al. | |
| 4,797,328 A | 1/1989 | Boehm et al. | |
| 5,011,511 A | 4/1991 | Beck | |
| 5,184,399 A | 2/1993 | Ueno et al. | |
| 5,286,441 A | 2/1994 | Shibata | |
| 5,372,298 A | 12/1994 | Glaeser | |
| 5,435,857 A | 7/1995 | Han et al. | |
| 5,447,683 A | 9/1995 | Montgomery et al. | |
| 5,527,628 A | 6/1996 | Anderson et al. | |
| 5,598,966 A | 2/1997 | Romano et al. | |
| 5,690,890 A | 11/1997 | Kawashima et al. | |
| 5,695,861 A | 12/1997 | Bloom | |
| 5,851,482 A * | 12/1998 | Kim | 420/557 |
| 6,047,876 A | 4/2000 | Smith | |
| 6,231,693 B1 | 5/2001 | Lugscheider et al. | |
| 6,319,617 B1 | 11/2001 | Jin et al. | |
| 6,367,683 B1 | 4/2002 | Rass et al. | |
| 7,041,180 B2 | 5/2006 | Lugscheider et al. | |

FOREIGN PATENT DOCUMENTS

| | | | |
|---|---|---|---|
| DE | 809 972 | | 8/1951 |
| DE | 1 128 672 | | 4/1962 |
| DE | 2 235 376 | | 2/1974 |
| DE | 195 26 822 A1 | | 1/1997 |
| DE | 199 53 670 A1 | | 5/2001 |
| EP | 0 235 546 A3 | | 9/1987 |
| EP | 0 652 072 A1 | | 5/1995 |
| GB | 1 357 073 | | 6/1974 |
| GB | 1 385 191 | | 2/1975 |
| JP | 57127596 A | | 8/1982 |
| JP | 59116350 A | | 7/1984 |
| JP | 60135550 | * | 7/1985 |
| JP | 03128192 A2 | | 5/1991 |
| JP | 03294449 | * | 12/1991 |
| WO | WO 97/03789 | | 2/1997 |
| WO | WO 99/02299 | | 1/1999 |
| WO | 0134860 | * | 5/2001 |

OTHER PUBLICATIONS

A.P. Xian, "Precursor film in a metal-ceramic wetting system," Welding In The World, vol. 30, No. 9/10, Sep. 1, 1992, pp. 243-251.

Soldering Manual, American Welding Society, Inc., selected pages ($2^{nd}$ ed. 1977).

Kapoor et al., "Tin-Based Reactive Solders for Ceramic/Metal Joints," Metallurgical Transactions B, vol. 20B, pp. 919-924 (Dec. 1989).

Hayduk, Jr., "Effect of Atmosphere Composition on Metallizing $Al_2O_3$ Substrates with Mo-Mn Paste," Reprinted from Solid State Technology (Apr. 1985).

J. Intrater, "Review of Some Processes for Ceramic-To-Metal Joining," Materials & Manufacturing Processes, 8(3), pp. 353-373 (1993).

Baudrand, "Electroless Nickel Plating On Metallized Ceramic," Reprinted from Plating Finishing (Sep. 1981).

"Standard Specification for Metalized Surfaces on Ceramic," Annual Book of ASTM Standards, Part II, (Reapproved 1978).

Brazing Handbook, American Welding Society, Inc., pp. 411-422 ($4^{th}$ ed. 1991).

* cited by examiner

ELECTRONIC PACKAGE FORMED USING LOW-TEMPERATURE ACTIVE SOLDER INCLUDING INDIUM, BISMUTH, AND/OR CADMIUM

RELATED APPLICATION

This application claims the benefit of priority to U.S. Provisional Patent Application No. 60/568,037 titled "Low-Temperature Active Solder Including Indium, Bismuth, And/Or Cadmium," filed on May 4, 2004, and to U.S. Provisional Patent Application No. 60/643,640 titled "Use of Active Solder Compositions in Electronic Packaging," filed on Jan. 13, 2005, the contents of which are incorporated in this application by reference.

TECHNICAL FIELD

The present invention relates generally to an electronic package formed using a solder alloy and, more particularly, to an active solder alloy composition including active and other elements that permit fluxless solder joining of workpieces below 180° C. The invention also includes a method for joining ceramics and other applications that benefit from the composition.

BACKGROUND OF THE INVENTION

The process of soldering is one of the most widely used joining techniques. Even wider use of soldering for joining workpieces would be possible absent several limitations inherent in conventional solder processes. Typically, conventional solder processes can be used successfully only (1) if the surfaces of the workpieces to be joined are cleaned and free of any oxide, nitride, or other stable compound layers present before application of the solder, to ensure good contact between the solder and the workpiece surfaces; (2) if a pre-coating with a flux is used at the same time as the solder; or (3) if the workpiece surfaces are cleaned and a precoating with a flux is used. These limitations mean that the workpiece surfaces to be soldered require a complicated pretreatment, that the soldering operation is made more complex by the use of added flux, or both. In addition, the risk exists that, after the soldering process, flux residues will remain on the soldered workpiece surfaces. Residual flux may cause problems in further processing steps or impair the long-term durability of the soldered joints.

Other conventional solder processes involve plating with a metal (e.g., Au) that does not form a stable oxide or compound upon heating or with a metal (e.g., Cu or Ni) that forms an oxide that is easily removed by fluxes. These processes require that the workpiece surfaces to be soldered receive multi-step pretreatment or plating, or that the soldering operation involves a multi-step procedure including the added use of plating, flux, or both. Some of these conventional soldering processes are hazardous to health, the environment, or both.

Other commercial soldering processes use soft solder alloys, which comprise tin and/or lead and possibly silver, and have a process temperature of about 180-280° C. Such processes have the further limitation that they wet many materials either not at all or only very poorly. Therefore, these processes cannot be used to join workpieces made of poorly wettable or entirely nonwettable materials such as ceramics.

Some soldering processes attempt to overcome this limitation by using activated soft solders. The activated soft solders, with a proportion of titanium as the "active" metal, exhibit significantly improved wetting even of surfaces that are poorly wettable. A significant limitation of the processes using active solders is, however, that they require process temperatures between 600° C. to 900° C. and require a protective atmosphere such as a high vacuum or a pure shielding gas. The high processing temperature severely limits the choice of solderable materials. Furthermore, the need for a vacuum or shielding gas complicates the soldering operation and, in many cases, precludes application of the process at all.

The active solders that have been recently developed include a certain amount of reactive elements, rare earth or lanthanide series elements (La, Ce, Ga, etc.), in combination with the titanium (or other elements of subgroup IVa and/or Va of the Periodic Table of the Elements) and conventional solder metals (i.e., tin, silver, indium, and the like). Such solder alloys wet and bond to a wider variety of materials than the unmodified solders would normally. These compositions are generally used to bond dissimilar materials, such as aluminum to copper or titanium to silicon carbide, or to join difficult-to-bond materials such as tungsten or titanium. These materials can also be useful in bonding silicon to electronic packaging materials such as alumina, copper-tungsten alloy, copper-molybdenum-copper alloy, and metal-ceramic composites such as aluminum silicon carbide.

The recently developed active solders have melting points above 200° C. (at 233° C. for a typical Sn—Ti—Ag—Ce—Ga alloy) and render joining successful at temperatures from 250-400° C. Solder processes that use these active solders are limited, however, to joining applications where joining temperatures are permitted to be above 250° C. There are many emerging applications in microelectronics; sensors; microelectro-mechanical (MEM) devices; and optical, polymer-coated optical, or metal-coated polymer devices that require solders that join below 180° C.

Conventional packaging of semiconductor devices uses a filled organic polymer, filled silicone polymer, or filled grease material to create a thermal pathway between the device and the package lid. These materials typically have no capability to join or bond, but must stay in place through normal use of the device. Replacement of these organic materials with metals, such as solders, substantially improves the rate of heat transfer out of the device, and can also aid in attaching the packaging materials to the silicon. The approximately tenfold increase in thermal conductivity found with metals allows devices to perform better by allowing operation at higher speeds, allowing an increased transistor count, or allowing a less complex system to remove the heat generated.

As mentioned above, however, conventional solder materials bond to semiconductor materials, ceramics, and metals only if the surface is pretreated to minimize the oxide naturally present on the surface of the substrate materials. The most common treatment is the use of a fluxing agent, which is a chemical designed to reduce the oxides present on the surfaces while not interfering with the attachment of the solder to the substrate. In semiconductor devices, where contamination can be catastrophic to their operation, the use of fluxes is not desirable. Instead, a layer of gold is frequently added to the surface of the device as well as the packaging material. This is done by one of several conventional processes, such as sputtering or chemical vapor deposition.

Because gold can diffuse into materials, and possibly damage a semiconductor device, or may have difficulty firmly attaching to some materials, adhesion and barrier layers are also added between the gold coating and the substrate surface. A common combination is nickel as an adhesion layer directly on the device or substrate, titanium or palladium as a barrier layer to prevent gold from diffusing into the substrate, and finally the gold layer. If the gold layer is processed correctly and kept free of excess oxide formation, then some conventional solders will bond directly to the gold without the use of flux.

Unfortunately, the creation of the additional layers adds multiple steps to the production process, increasing cost, increasing the risk of part failure during processing, and possibly not improving the thermal performance of the total package due to the resulting relatively thick metal layer between the device and its package. For certain special cases, the process of eutectic copper bonding can be used; this process is even more expensive and complicated.

In view of the shortcomings of existing active solder alloy compositions and processing methods, a need remains for a new alloy composition and processing method for making higher-strength joints. This need is especially acute in the areas of electronic packaging, optical packaging, cold plates, and heat spreaders.

Therefore, an object of the present invention is to provide a soldering process, for joining workpieces, which enables more versatile applicability of the soft-solder technique. More specific objects of the present invention are to provide a soldering process that functions not only in inert and other protective atmospheres but even in oxygen-containing atmospheres such as, for example, in air; has a relatively low processing temperature; and wets even poorly wettable surfaces. Still another object of the present invention is to provide a process that avoids the need for a flux.

In particular, it is an object of the invention to provide a low-temperature (less than about 180° C.) active solder alloy. A related object is to introduce a method to join ceramic, silicon, composite, or corrosion-resistant metals, using such low-temperature active solders. Another related object is to identify applications where such a low-temperature active solder would be used. Like other active solders, the compositions of the present invention can be processed in air and will wet surfaces that per se are poorly wettable, such as ceramics, silicon, composites, or metals with ceramic layer surfaces.

SUMMARY OF THE INVENTION

To achieve these and other objects, and in view of its purposes, the present invention provides an alloy, in particular a low-temperature active solder alloy, which enables more versatile application of the active soft-solder joining below 180° C. This invention adds indium, bismuth, or cadmium to levels that are not contemplated by the current active solder compositions. One advantage of the invention is that the high concentrations of indium, bismuth, or cadmium in combination with the other active elements, as specified below, have wetting capability and join to ceramics and other ceramic-like surface films without the use of flux or plating. Another advantage of the invention is that these temperature-lowering elements retain the active nature of the active solder and provide an entirely new range of active soldering temperatures from 40-180° C., depending on the combinations of elements.

The invention encompasses an active solder alloy, an electronic device package including the active solder alloy bonding an electronic device to a substrate, and a method of forming high-strength, high-thermal conductivity joints by soldering using the solder alloy. The alloy contains up to about 10% by weight of an element or a mixture of elements selected from the group consisting of titanium, zirconium, hafnium, vanadium, niobium, or tantalum; between about 0.1 and 5% by weight of an element or a mixture of elements selected from the group of the lanthanides (rare earths); between about 0.01 and 0.1% by weight of gallium; up to about 10% by weight of silver; up to about 2% by weight of magnesium; and a remainder consisting of tin, bismuth, indium, cadmium, or a mixture of two or more of these elements. The alloy enables low-temperature (less than about 180° C.) soldering within relatively narrow melting ranges (less than about 10° C.).

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing is a single FIGURE.

DETAILED DESCRIPTION OF THE INVENTION

Figure 1:
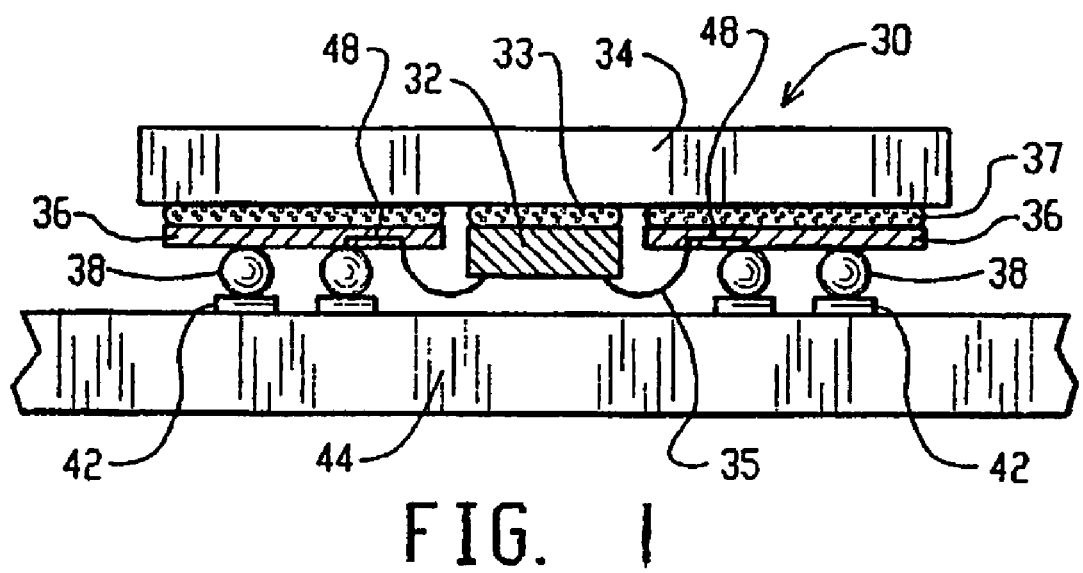
FIG. 1 is a cross-sectional elevation view of a BGA package.

This patent application describes a series of lower-temperature active solders to for use in electronic packaging. The reason to create lower temperature active solders, in contrast to the known active solder compositions (e.g., the Sn—Ag—Ti—Ga—Ce composition taught by U.S. Pat. No. 6,231,693 issued to Lugscheider et. al.), lies in the need to join at temperatures below 220° C. and even more importantly below 183° C. This latter temperature is the eutectic melting temperature for the Pb—Sn solders that are still being used as solder interconnects in direct mount, ball grid arrays (BGA's).

A solubility curve defines the solubility limit (maximum solute addition without supersaturation) of a solid in a liquid. The point at which two solubility curves intersect in a phase or equilibrium diagram (a map from which the phases present at any particular temperature or composition can be read if the alloy is at equilibrium, i.e., if all possible reaction has been completed) defines both the eutectic temperature, the lowest temperature at which the solution remains liquid, and the eutectic composition, the composition of this low-melting liquid. A solution of eutectic composition changes from a single liquid solution into two solid phases as it is cooled-through the eutectic temperature, according to the general eutectic reaction, $L_2 \rightleftarrows S_1 + S_3$, where the arrow directed right reflects cooling. Heating reverses the reaction (the arrow directed left in the reaction reflects heating). The subscripts imply progressively higher amounts of one of the components.

The liquidus temperatures are the locus of temperatures above which all compositions are liquid (i.e., only liquid is stable). The solidus temperatures are the locus of temperatures below which all compositions are solid (i.e., only solids are stable). Every phase diagram for two or more components must show a liquidus and a solidus, and an intervening freezing range. The liquidus and solidus meet at the eutectic and where single phases melt.

A. Electronic Packaging

Electronic packages have a hierarchy of joints including interconnects, joints to heat-spreader bases, and joints to the lids that seal the packages. As microprocessor chips in packages get faster and smaller, their heat output gets higher and more concentrated. To remove the heat from the packages, manufacturers are more dependent on directly mounting chips using BGA attach. The use of additional heat spreader lids that are directly mounted to the back of the processor chip are emerging as the norm. Where thermal greases and silver-filled epoxy had been used, their low thermal conductivity limited the heat extraction capability of the joint. Therefore, microprocessor manufacturers have looked to directly attaching the processor chips (normally Si dies) with solders.

These solders must be able to bond to the back of the processor chip and to the thermal heat sink lid without damaging the chip and the interconnects. This requirement renders it preferable that the solders melt below the interconnect solders and below the mounting solders. Targeted solder processing temperatures are from 115-180° C. This active solder processing temperature range would enable active solders to be used in a wide range of electronic packages. Perhaps more important, a range of solders in this temperature range would provide for stepped-solder assembly of an electronic package known as hierarchical solder joining.

B. Candidate Solder Bases

Candidate active solder bases include indium, tin-indium, tin-bismuth, and tin-cadmium alloys that all have melting ranges below 180° C. The goal of the present invention is to make these solders active and able to directly react with, wet, and adhere to the surfaces of electronic packaging processor materials (including silicon, GaAs, and SiC) and with base or lid materials (such as copper, copper tungsten composites, aluminum oxide, aluminum nitride, Al—SiC, diamond, diamond composites, pyrolytic graphite, graphite foams and other low-expansion, high-conductivity materials). Conventional solders, such as those patented by Lugscheider et. al., typically have elemental additions that include gallium, titanium (or other reactive Group IVA or Group VA elements such as Hf, Zr, Ta, and the like), and rare earth (lanthanide) elements such as Ce, La, Lu, Er, or Y. Although active below 850° C., these conventional solders are unable to meet the targeted solder processing temperatures. Therefore, there exists a need for active solders that will melt in the desired temperature range from 115-180° C.

Indium melts at 157° C. making it ideally suited as a low-temperature solder. Tin-indium alloys melt below 157° C., down to a eutectic temperature of 120° C. where the tin-indium-alloy melts at a single temperature making another solder base. Tin-bismuth alloys have a eutectic melt temperature of 139° C., which provides for another solder base that melts in between the tin-indium alloy eutectic and the indium solder. Tin-cadmium alloys have a eutectic melt temperature of 177° C., which provides for a solder base that melts below the lead-tin eutectic and above the indium solder. Indium melts at a single temperature and is very fluid at and above its melt point. Eutectic compositions of tin-indium and tin-bismuth offer similar properties to pure indium in that they melt at or near a single temperature and can be very fluid.

The alloy of the present invention has at least six components. The first component is an element or a mixture of elements of subgroup IVa and/or Va of the Periodic Table of the Elements. The elements of subgroup IVa and/or Va of the Periodic Table of the Elements include, among others, the elements titanium, zirconium, hafnium, vanadium, niobium, and tantalum, of which titanium is preferred. The second component is an element or a mixture of elements of the lanthanide group. The elements of the lanthanide group include, among others, lanthanum, cerium, praseodymium, neodymium, gadolinium, ytterbium, lutetium, of which cerium is preferred. The third component is gallium. The fourth component is silver or copper. The fifth component is magnesium. The sixth, remainder component is tin, indium, bismuth, cadmium, or a mixture of two or more of these elements.

C. Roles of the Solder Composition Elements

The alloys of the present invention preferably have additions of the following groups in order to develop their unique, active properties that permit the wetting and joining of many of the electronic packaging materials without the need for flux or pre-metallization or plating. The functions of the individual alloy components can be described as follows.

1. Titanium. The first component is an element or a mixture of elements of subgroup IVa and/or Va of the Periodic Table of the Elements, in particular of titanium. Titanium has been found, under certain conditions and like the rare earth elements, to enhance the wetting and reacting capacity of molten metal solder fillers. Thus, the first component increases the wetting power of the alloy, in particular for oxide, nitride, or carbide ceramic surfaces. The first component further serves to reduce the surface tension of the alloy in the molten state.

Titanium and other Group IVA and VA reactive transition metals (Hf, Zr, Ta) have historically been added to braze fillers for high-temperature joining. Titanium has been known in these fillers and above 850° C. to react and reduce many oxides and nitrides such as $Al_2O_3$, AlN, SiC, and $Si_3N_4$. At these elevated temperatures, the reactive Group IVA and VA elements have a high activity and react to form surface films that are wetted and adhered to by the molten fillers.

A unique characteristic of the active solder filler metals is that the combination of gallium and the rare earth elements in the active solder fillers lowers the temperature at which titanium will reduce surface compounds. The literature had taught that titanium was only "active" above 850° C., which forces fillers with titanium additions to be brazed in high vacuum. In combination with gallium and cerium, however, the activity of titanium has been raised sufficiently to be able to diffuse to the surfaces of molten active solders and interact with the surface compounds, further enhancing the ability for active solders to bond to materials such as ceramics, aluminum composites (AlSiC), graphite, diamond, stainless steel, and even titanium.

When it is used, the preferred compositional range of the first component is from 1-10 weight percent. Lesser amounts, down to 0.1%, can be beneficial. The alloying of titanium into indium, tin-indium, and tin-bismuth alloys at amounts above 10% renders questionable whether a processable filler material will result.

2. Cerium. The second component is an element or of a mixture of elements of the lanthanide (or rare earth) group, in particular cerium. Because cerium has a high affinity to oxygen, this component prevents the oxidation of the first component (e.g., titanium). The high affinity between cerium and oxygen also prompts oxygen from the environment, from oxide layers of the materials to be joined, or from other sources to preferentially form compounds with the cerium and not with the titanium. Therefore, the titanium will remain, at least largely, in non-oxidized form and will be able to deploy its positive effects.

Cerium has been found by X-ray Photon Spectroscopy (XPS) analysis to rapidly concentrate at the surface of the active solders as they heat about their solidus and then above their liquidus. The small atomic sizes of the lanthanide elements permit them to rapidly diffuse to surfaces. This characteristic concentrates cerium at the surface of the molten solder filler where it increased the activity of the reactive element.

Cerium and its related lanthanide elements are known for their high activity and ability to react with both oxides and nitrides. Cerium oxide is a tenacious, adherent protective oxide that when formed is a good barrier against further oxidation. This characteristic distinguishes cerium from other metal oxides, such as NiO and $Fe_xO_y$, that easily transport oxygen through their layers.

Cerium and the other rare earth elements are known to be able to reduce and substitute into oxide and nitride films; thus, the molten active solder filler has the capacity to react with and wet the surfaces of many different materials. The chemical activity of cerium that reacts it with many surface compounds is a key feature in the elimination of the need to conduct chemical fluxing to remove stable oxide or nitride layers and expose fresh base material, or the need to plate with metals that do not form stable oxides (e.g., Au, Cu, or Ni). The rare earth elements directly react with the material surface and enable direct wetting and adherence.

The preferred compositional range of rare earth elements is from 0.1-5%. The upper limit is dictated by the limited solubility of these elements in the indium, tin-indium, and tin-bismuth base solders.

3. Gallium. The third component, gallium, is a low-temperature (28° C.) melting element that is added to the active solders to modify the oxidation behavior of the surface of the solders as they heat and begin to melt. In addition, Ga and Ga-oxide interacts with at the surface and modifies the wetting behavior of the molten active solder fillers, permitting them to be in intimate surface contact with base materials and attaching at key grain boundary points since Ga is known to substitute easily into the grain boundaries of many metals and their oxides. This wetting behavior is an important first step in reacting with the surface layers that form. It has been found that relatively low concentrations (0.01-1.0 weight percent) of Ga are preferred; too much Ga would drop the solidus and tend to attack grain boundaries of many metals (causing liquid-metal embrittlement).

The combination of gallium and cerium in the alloy composition of the present invention has been found to be synergistic and beneficial for the active solder joining of ceramics, silicon, composites, and metals. The XPS results have shown that, in the early stages of melting, the gallium immediately comes to the surface of the heated active solder fillers where it oxidizes and forms a protective oxide scale. This oxide scale protects the underling base metals (e.g., Sn, Ag, and/or Ti) from further oxidation. Upon heating above the solidus temperature, where some liquid fraction is generated, the lanthanide element, cerium, rapidly diffuses to the surface and through the gallium oxide layer where cerium oxide forms an even more tenacious and protective oxide. In the liquid state of the active solder filler, the cerium oxide enhances the protection of the active elements (e.g., Ti) remaining in the molten filler. Upon fracture of the cerium oxide film, the gallium is released to penetrate and interact with the surface grain boundaries, modifying them and making them more active sites for the reactions with the lanthanide elements, cerium, and the titanium as the filler metals are further heated and mechanically activated.

Thus, through XPS analysis and actual bonding experiments it has been found to be advantageous to have a combination of gallium with the lanthanide elements such as cerium. In combination, they work synergistically to protect the underlying solder fillers from excessive oxidation before they are mechanically activated in preparation for their wetting and bonding to ceramic, silicon, composite, and metal surfaces. Upon activation, the gallium prepares the surfaces by making active sites where the lanthanide element can react at a much faster rate. In essence, the gallium acts as a catalyst for wetting and adherence when in the presence of lanthanide elements.

4. Silver. Silver and copper are elements that are normally added to modify the strength, ductility, or both strength and ductility of solder materials. When it is used, the preferred compositional range of the fourth component is from 1-10 weight percent. Lesser amounts can be beneficial. Silver and copper increase the melting range and generally raise the liquidus of most indium, tin-indium, tin-cadmium, and tin-bismuth alloys, however, so additions of these elements are made judiciously in order to yield the required final filler properties (e.g., processability) and final joint properties. Between silver and copper, the former is preferred for processability (copper is added for strength).

5. Magnesium. Magnesium is another powerful oxidizer that can be added, in small quantities (up to about 2 weight percent), to molten solder fillers to enhance reactivity with particular oxides, for example $SiO_2$. From work that has been recently completed, it has been found that magnesium additions from 0.1-1.0 weight percent led to enhanced wetting of the magnesium-modified active solders to silicon. Silicon in the presence of air, and especially when heated to molten solder filler temperatures, is known to form $SiO_2$ as a barrier coating. This oxide is very stable and, in most cases, is resistant to further oxidation and reaction with many oxidizers. Recently completed evaluations indicate that small concentrations of magnesium in the active solder bases enhance the capability to react with and develop a more tenacious bond between the solidified solder and silicon surfaces. Therefore, for applications that would involve silicon joining, such as in die or lid attach to silicon dies, the addition of magnesium to the solder alloy is advantageous. Although joining would be possible using a solder alloy composition lacking magnesium, the inclusion of magnesium facilitates the joining process by making that process easier and more efficient.

6. Remainder. The elements of indium, bismuth, or cadmium that comprise the sixth (remainder) component are important because these elements lower the soldering temperature to below 180° C. In some compositions, solder alloys of the present invention have liquidus temperatures as low as 40° C. This component also enables the active nature of the solders that are achieved by the other active elements of the alloys.

The processing temperature of the alloy according to the invention is preferably between 40° C. and 180° C. In contrast to the known active soft solders, the processing temperatures of an alloy according to the invention are therefore significantly reduced. With the addition of further components such as the above-mentioned silver (or copper) and gallium, the properties of the alloy can be tailored to the value-desired characteristics for each particular application. The alloys may be designed to be either eutectic (singular melting point) or designed to melt over a small designed range of temperatures to affect the behavior of molten solders during joining. The composition ranges of elements such as indium, bismuth, or cadmium in combination with tin can be selected to create a solder melting range that may aid in component assembly.

In electronic packaging applications, the demands for capillary flow and precision generally require solder alloys that melt over narrow temperature ranges (i.e., less than 10-15° C.) unless the solders are being used for a specific rheological property. Therefore, the preferred embodiments of the active, low-temperature solders of the present invention melt over such narrow temperature ranges. The melting temperature ranges of the preferred embodiments are ±10° C. around the melting temperature of pure indium (159° C.), of the tin-indium 51 weight percent indium eutectic (120° C.), of the tin-cadmium 33.5 weight percent cadmium eutectic (177° C.), and the tin-bismuth 57 weight percent eutectic (139° C.) compositions.

The joining mechanism achieved using the alloy composition of the present invention is based on lower liquidus temperatures while maintaining active solder behavior. The mechanism provides a number of important advantages. Among those advantages are that the reactive alloy components react and/or interact with any oxide, nitride, or carbide layers present on the surfaces of the workpieces to be joined. The surface tension in the molten state is modified as a result of interactions between the alloy components and the surrounding media and enables molten solder alloy to wet the surfaces to be joined. In addition, the alloy attaches to base materials such as ceramics, silicon, or other corrosion-resistant metals via physical forces and attaches to other metals via activated metallurgical reactions.

D. Role of Active Elements in Melting & Processing as Measured by XPS

Active solders have different oxidation and interaction properties than conventional tin, tin-silver, and tin-lead solders. These properties lead to their unique behavior, eliminating their need for flux or metallization or plating of base materials. XPS surface analysis has confirmed this unique behavior and the individual and specific role of each of the active elements. First, gallium was shown to be an important elemental addition that aids wetting and oxidation protection of the indium, tin-indium, and tin-bismuth base solders. Upon heating from room temperature to just before the solidus of the alloy, XPS measurements showed that the gallium element rapidly diffused to and concentrated at the surface of the active solder as it heated to the solidus of the active solders. At the solder surface, gallium oxidized in the oxygen-containing atmospheres and formed a tightly adherent gallium-oxide film that prevented further oxidation of the tin, indium, bismuth, or gallium elements present in the active solder. The reduced oxidation of the active solder permitted these solders, without flux, to be easily disrupted and wetted.

Second, upon heating over the solidus temperature as the active solder begins to melt, the cerium (and other lanthanide elements) rapidly diffuses through the gallium-enriched layer. Here, the cerium was found by XPS to interact with the air, oxidize, and form a protective cerium oxide layer that further slowed the oxidation of the tin, indium, or bismuth elements found in the solder bases. This protective cerium oxide protected the molten solder and prevented further solder oxidation. Thus, the combination of gallium and cerium (or other lanthanide elements) were observed to be critical in protecting the active elements in the solders bases and reducing oxidation that would normally have to be removed by fluxes. The protection offered by gallium and cerium also protects the other active elements, including the cerium and, if added, titanium and other Group IVA and VA elements, permitting them to be in higher concentration at the surfaces of the molten active solders and thus producing a higher activity and thus a higher affinity for reacting with base material surface layers.

Third, XPS analysis showed that if titanium or other Group IVA and VA elements were present, further heating concentrated the titanium element at the surfaces of the active solders, when heated well above their liquidus. This extra concentration of titanium further increased the activity of the active solders and may play a role in further enhancing the reaction of the active solder with base materials such as copper, aluminum, stainless steel, titanium, silicon, and even aluminum nitride. The gallium and cerium were critical, however, in preventing the excess surface loss of titanium during heating to the liquidus of the active solder. These elements, gallium and cerium, thus permitted titanium to concentrate at the molten active solder base material interfaces at a proper time.

E. Preferred Active Solder Bases

The following examples are included to more clearly demonstrate the overall nature of the invention. These examples are exemplary, not restrictive, of the invention.

In broad terms, the low-temperature active solder alloy composition of the present invention includes: up to 10% by weight of an element or a mixture of elements selected from the group consisting of titanium, zirconium, hafnium, vanadium, niobium, or tantalum; between 0.1 and 5% by weight of an element or a mixture of elements selected from the group of the lanthanides (rare earths); between 0.01 and 1% by weight of gallium; up to 10% by weight of silver; up to 2% by weight of magnesium; and a remainder consisting of tin, bismuth, indium, cadmium, or a mixture of two or more of these elements. Of course, the composition may include the typical impurities as would be within the knowledge of a person of ordinary skill in the art. Preferentially, the alloy composition has one of three specific remainders: indium alone, indium-tin, or bismuth-tin. A cadmium-tin remainder is also possible.

For the preferred alloy having an indium-only remainder, the composition also has up to about 10% by weight of an element or a mixture of elements selected from the group consisting of titanium, zirconium, hafnium, vanadium, niobium, or tantalum (i.e., this component is optional); between about 0.1 and 5% by weight of an element or a mixture of elements selected from the group of the lanthanides (rare earths); between about 0.01 and 1% by weight of gallium; up to about 10% by weight of silver (i.e., this component is optional); and up to about 2% by weight of magnesium (i.e., this component is optional). The melting temperature range for this alloy composition is between about 150-170° C. The most preferred composition for the alloy having an indium-only remainder is about 0.1% by weight of an element or a mixture of elements selected from the group of the lanthanides; about 0.1% by weight of gallium; and about 0.1% by weight of magnesium. The melting temperature range for this most preferred alloy composition is between about 155-160° C.

For the preferred alloy having at least indium and tin in the remainder, the remainder has about 40-70% by weight of indium, up to about 10% by weight of bismuth (i.e., this component is optional), with a balance of tin. The composition also has up to about 10% by weight of an element or a mixture of elements selected from the group consisting of titanium, zirconium, hafnium, vanadium, niobium, or tantalum (i.e., this component is optional); between about 0.1 and 5% by weight of an element or a mixture of elements selected from the group of the lanthanides (rare earths); between about 0.01 and 1% by weight of gallium; up to about 10% by weight of silver (i.e., this component is optional); and up to about 2% by weight of magnesium (i.e., this component is optional). The melting temperature range for this alloy composition is between about 110-160° C. The most preferred composition for the alloy having at least indium and tin in the remainder is about 2% by weight of an element or a mixture of elements selected from the group consisting of titanium, zirconium, hafnium, vanadium, niobium, or tantalum; about 0.1% by weight of an element or a mixture of elements selected from the group of the lanthanides; about 0.1% by weight of gallium; about 2% by weight of silver; and about 0.1% by weight of magnesium, with a remainder having about 51% by weight of indium and a balance of tin. The melting temperature range for this most preferred alloy composition is between about 118-122° C.

For the preferred alloy having at least bismuth and tin in the remainder, the remainder has about 40-70% by weight of bismuth, up to about 10% by weight of indium (i.e., this component is optional), with a balance of tin. The composition also has up to about 10% by weight of an element or a mixture of elements selected from the group consisting of titanium, zirconium, hafnium, vanadium, niobium, or tantalum (i.e., this component is optional); between about 0.1 and 5% by weight of an element or a mixture of elements selected from the group of the lanthanides (rare earths); between about 0.01 and 1% by weight of gallium; up to about 10% by weight of silver (i.e., this component is optional); and up to about 2% by weight of magnesium (i.e., this component is optional). The melting temperature range for this alloy composition is between about 130-170° C. The most preferred composition for the alloy having at least bismuth and tin in the remainder is about 2% by weight of an element or a mixture of elements selected from the group consisting of titanium, zirconium, hafnium, vanadium, niobium, or tantalum; about 0.1% by weight of an element or a mixture of elements selected from the group of the lanthanides; about 0.1% by weight of gallium; about 2% by weight of silver; and about 0.1% by weight of magnesium, with a remainder having about 57% by weight of bismuth and a balance of tin. The melting temperature range for this most preferred alloy composition is between about 139-141° C.

The preferred active solder bases are shown in Table I. The elements are added in the proportions as the preferred nominal composition and a desired range. The reasons supporting the selection of these preferred compositions are as follows.

1. Indium. Indium is an electrically and thermally conductive pure element (metal) that melts within the temperature range of interest (157° C.), has excellent fluidity, and is somewhat active in that it wets many metals, ceramics, and glasses. Unfortunately, however, indium alone does not wet silicon. This inability to wet silicon is a major impediment for electronic package assembly applications and related silicon die attach to bases and lids for thermal management. Therefore, active elements such as those described above are essential in making substantially pure indium wet and adhere to silicon, without pre-plating with gold (Au), for certain applications.

2. In—Sn Alloys. The inclusion of indium drops the liquidus temperature of tin alloys. When alloyed with tin and eventually when present at about 51 weight percent, indium creates a eutectic alloy that melts at about 120° C. On either side of this eutectic composition (50.9 weight percent indium), the indium-tin alloys increase the liquidus of the composition while the solidus remains fixed by the eutectic temperature (120° C.). So increasing or decreasing the indium concentration will increase the melting range as the liquidus temperatures increase.

Normally narrower ranges of melting (0-10° C.) are preferred in electronic packaging joining applications. Therefore, there is a range of indium concentration on either side of this eutectic point that is practical and preferred (about 40-70 weight percent indium). Again, as discussed above, for these indium-tin alloys to wet to silicon and other typical electronic packaging materials, gallium, cerium, and in some cases titanium must be added to cause the indium-tin alloy to be able to wet and adhere. This composition range, in combination with gallium, cerium, and sometimes titanium, creates an active solder that can join from 110-160° C., a range that is low enough to be very practical for joining packages that already have solder joints and/or interconnections made with lead-tin and/or tin-silver solders.

3. Bi—Sn Alloys. Bismuth is another element that drops the liquidus temperature of tin alloys when alloyed with tin. Eventually, when present at about 57 weight percent bismuth, a eutectic alloy is created that melts at about 139° C. On either side of this eutectic composition (57 weight percent bismuth), the bismuth-tin alloys increase the liquidus of the compositions while the solidus remains fixed by the eutectic temperature (139° C.).

The advantage of bismuth over indium additions is that the cost of bismuth is substantially lower than indium and could be used in electronic packaging applications where cost is driven by the materials cost of the solders. For electronic packages that are used in high-performance, high-value added processors, cost does not drive the selection of materials. Where low-cost filler is a strong selection criterion, however, bismuth additions would be preferred over indium. On the other hand, bismuth-tin alloys are substantially less ductile than either indium or indium-tin alloys—making these alloy compositions preferable over the bismuth-tin alloys when ductility is a requirement.

As with the indium-tin alloys, increasing or decreasing the bismuth concentration in tin will increase the melting range as well as the liquidus temperature of the alloy. Normally narrower ranges of melting (0-10° C.) are preferred in electronic packaging joining applications. Therefore, there is a range of bismuth concentration on either side of this eutectic point that is practical and preferred (about 40-70 weight percent bismuth). Again, as discussed above, for these bismuth-tin alloys to wet silicon and other typical electronic packaging materials, gallium, cerium, and in some cases titanium must be added to cause the bismuth-tin alloy to be able to wet and adhere. This composition range, in combination with gallium, cerium, and sometimes titanium, creates an active solder that can join from 130-170° C., a range that is low enough to be very practical for joining packages that already have solder joints and/or interconnections made with lead-tin and/or tin-silver solders.

4. Cd—Sn Alloys. Cadmium is another element that drops the liquidus temperature of tin alloys when alloyed with tin. Eventually, when present at about 33.5 weight percent cadmium, a eutectic alloy is created that melts at about 177° C. On either side of this eutectic composition (33.5 weight percent cadmium), the cadmium-tin alloys increase the liquidus of the compositions while the solidus remains fixed by the eutectic temperature (177° C.).

F. Method of Use

The present invention also includes a method able to produce higher-strength joints on ceramics, silicon, composites, and certain metals including, for example, titanium and stainless steel. An example of a joining method using the active solder composition of the present invention includes the following steps:

1. pre-treating the ceramic or metal at elevated temperatures (defined by the temperatures sufficient to get metallurgical reactions between the active elements in the solder and the base materials) in a vacuum or protective atmosphere with a conventional layer (e.g., a conventional active solder) placed onto the surfaces to be joined by solder;

2. after pretreatment, placing the active, low-temperature (110-180° C.) alloy solder of the present invention into the joints where the pre-treated layer has been provided;

3. completing the solder joining via heating the joint to between 110-180° C. (in a protective atmosphere or in air) to melt (or re-melt) the active, low-temperature alloy solder and disrupt the oxide scales that reform on the molten solder layers;

4. using a brush, scraper, or other tool to rub or scrub the molten solder into the silicon surface to activate the solder, completely wet the surface, and insure a uniform coating; and 5. cooling to re-solidify the solder alloy.

The assembly may then be further processed into a completed electronic component and, finally, incorporated into a device or product in a conventional way.

The activation of the solder during the final joining step (Step 4) can be done by sliding one component relative to another with an oscillation of at least about 0.0127 mm (5 thousands of an inch) either side of center (e.g., by sliding the lid into place by placing one edge against one edge of the die and sliding the lid across the length of the die). The technique of sliding the full length is preferred when using active solders as they tend to be less fluid than conventional solders, and so trap more air, which leads to voids in the solder bond. Pushing across the full length of the component minimizes the amount of voiding by pushing air out of the solder, with the shear force helping to break up any entrapped air into smaller regions. In the case where a pocketed lid is used, or one that has a recess into which the chip fits, removing one side of the pocket to create a U shape permits sliding the chip over the full length of the die while maintaining some of the mechanical strength and heat transfer advantages of the pocketed lid.

Active solders can be used to directly join silicon, gallium arsenide, silicon carbide, and other semiconductor devices to their packaging. The details of the bonding process are determined by the specifics of the part geometries and the substrates involved, but require one or more activation steps to break the oxide film on the molten solder to allow a reaction between the bulk solder and the substrate surface. The necessary process steps may be completed sequentially, or some done at one time and the rest finished later. Active solders and their properties are stable in storage in the solid state and so can be, for instance, coated onto a surface and the joining completed later by reheating the part and activating the solder.

Active solder alloys can be used to join semiconductor devices to their packaging, resulting in improved thermal conductivity of the package versus conventional organic polymer based thermal interface materials. Active solders are simpler and less expensive to employ than conventional solders because the active solders avoid the need for deposition of multiple metallization layers or the use of flux needed with conventional solder materials. The active solder can be bonded to the substrate surfaces by rubbing, scrubbing, use of ultrasound to agitate the parts, or a separate metallization treatment that produces a permanently bonded layer on one or more of the substrates. The method of bonding the component parts can be done by placing the parts atop one another, the use of ultrasound to agitate the interface between the parts, or sliding one part across the length of the other.

Active solders tend to form tenacious metal oxide films when melted in the presence of oxygen, requiring the application of some degree of mechanical energy to break through this layer and allow non-oxidized bulk solder material to contact the surfaces to be joined. This energy is usually applied through movement of the parts, either by mechanical manipulation or application of ultrasound to the parts to be joined. Once the bulk molten solder is allowed to contact the substrate surface, a reaction occurs between the constituents of the formulation and the surface that results in a commercially useful bond. The exact mechanism of this bond varies with the substrate material, and can be a true covalent chemical bond or an associative bond similar to hydrogen bonding, or can result from partial destruction of a surface oxide layer thus allowing the solder components access to the underlying material.

The method in which the mechanical energy is applied is dependent upon the configuration of the component parts. The action of sliding one part past another across the length of the joined area results in both activation of the active solder as well as exclusion of the bulk of the entrapped air from the joint. Minimizing trapped air, or voiding, in a bond allows for improved heat transfer and improves the life of the joint during thermal cycling because voids act as initiators for debonding of the solder from a substrate due to the stress induced by the differential thermal expansion in the system.

Active solder alloys having the composition of the present invention can be used to join a multiplicity of metallic and nonmetallic materials, even oxidic and nonoxidic ceramic materials, to themselves or to other materials. Joining by soldering can advantageously be carried out in an oxygen-containing atmosphere, for example in air. Furthermore, in general, it is not necessary to use a flux or pre-plating.

G. Example Applications

The development of the low-temperature solder alloy compositions of the present invention has been precipitated by the need for lower-temperature active solder alloys that can join to a range of electronic materials, including silicon, gallium arsenide (GaAs), silicon carbide (SiC), alumina, aluminum nitride, graphite, diamond, aluminum composites, Kovar® and Invar® alloys, Cu—W composites, and nickel and gold plated metals. Thus, the present invention relates to the use of active solder formulations to directly attach a computer chip, microelectronic mechanical system (MEMS) device, or other electrically active object made of silicon, gallium arsenide, silicon carbide, or similar materials directly to the ceramic, composite, or metal packaging used to contain it. Direct die attachment is a technique for reducing the resistance to heat transfer from an active electronic system, thus allowing it to operate at a faster speed, contain more operating circuits, or otherwise perform at a higher level than that possible when the natural heat generated in the circuitry must first go through a thermal interface material of lower thermal conductivity due to the properties of the material or the increased heat transfer path resulting from the additional plating necessary to use conventional solders.

Applications that use the lower-temperature active solders (120-180° C.) include but are not limited to: (1) electronic die attach to ceramic, metallic, and composite substrates; (2) electronic hermetic packages; (3) optoelectronic packages to fix and/or seal glass fibers into the packages, seal the hermetic package, join the thermal management bases, and/or provide a hierarchical solder filler to support sequential solder joining; (4) other microelectronic or photonic devices that cannot exceed 180° C.; (5) tin-coated or other coated components that cannot have their coatings melted; (6) optics and lenses where optical coatings cannot exceed 180° C.; (7) ceramic-to-metal joints that cannot be heated above 180° C. due to thermal expansion mismatch; and (8) polymer/metal interconnect leads where the polymer cannot exceed 180° C.

More specifically, die attach is the joining of processor chips made of materials such as silicon, GaAs, and SiC to different base materials incorporating thermal management and/or coefficient of thermal expansion (CTE) management base metals into their attachment schemes.

Thermal management of electronic packages, optoelectronic packages, laser diodes, and power modulation is a requirement. Managing the flow of heat out of a chip package is critical to the operation of high-speed, high-performance, high-density, and high-power processors. In these chip packages, the silicon, GaAs, or SiC processor materials are bonded to lids, heat sinks, and convective elements such as fins, porous metals, or graphite or to cold plate surfaces. In the past, thermal greases and metal-filled epoxies sufficed as a bonding agent. As the heat flux outputs of these high-power and high-speed devices have increased, however, solid metal attachments using solders have emerged as the process and material of choice. Active solders that can bond to the range of materials that are used in components such as lid attaches, heat sinks and spreaders, convective elements, graphite foams, and cold plates and can bond without chemical fluxes and without pre-metallization offer unique solutions for thermal management.

Most specifically, electronic packages or components, with integrated circuit (IC) chips or dies electrically connected by solder balls, wire bonds, or the like to a ceramic chip carrier, which in turn are electrically connected by additional solder balls to another electronic component such as a printed circuit board assembly, are well known in the art. This type of package is frequently called a "ball grid array" or "BGA" package. In conventional BGA packages, the chip and the ceramic chip carrier are frequently bonded to a copper or other metal sink or spreader. This removes heat from the die, to keep the die as cool as possible.

FIG. 1 illustrates a BGA package 30. In package 30, an integrated circuit chip 32 is bonded by a layer 33 of the active solder alloy composition of the present invention to a metal plate or heat sink 34, sometimes referred to as a heat spreader because it distributes heat across the package 30. The heat sink 34 is preferably of copper. Chip 32 is connected by wire bonds 35 to conductive pathways (two of which are shown schematically as item 48 in FIG. 1) in four trapezoidal circuitized ceramic chip carriers 36. Each of these chip carriers 36 is bonded to the metal heat sink with adhesive 37. Solder balls 38, which are connected by the conductive pathways in the chip carriers 36 and wire bonds 35 to the integrated circuit chip 32, are also connected to metal contacts 42 on a printed circuit board 44 or other component. These solder balls 38 are made of a conventional solder material.

The metal heat sink 34 controls expansion of the ceramic chip carriers 36 and, in typical installations, more closely matches the expansion characteristics of the printed circuit board 44. Both the metal heat sink 34 and the printed circuit board tend to have coefficients of expansion in the range of $16 \times 10^{-6}$ to $21 \times 10^{-6}$ cm/cm° C. The ceramic carriers 36 tend to have coefficients of expansion of about $6 \times 10^{-6}$ to $8 \times 10^{-6}$ cm/cm° C.

Regardless of the type of electronic package, whether a BGA direct mount technology or another, if lead-tin solder is used in the package then processing temperatures must be below the lead-tin eutectic temperature of 183° C. This means that the indium-tin alloys are preferred. The reprocessing of processor chip sets involves exposing the die-lid joint to re-melt temperatures above 260° C., however, because many of the board interconnects are now being made with lead-free (Sn—Ag—Cu) solders. Therefore, higher-temperature active solders may be specified for these applications because, even if liquid, these active solders resist flow.

In contrast, for PGA (pin grid array) mount processor sets, the pin interconnect must stay well below 183° C. during the lid-die attach and, because it is pin mounted, the lid-die set is not exposed to post-lid attach reflow processing temperatures. For these applications, indium (157° C.) or bismuth-tin (139° C.) active solders might be applicable. The choice of active solder composition will be affected by end use, post-lid attach processing temperatures, and final thermal cycling.

Packages that are hermetically sealed, RFI/EMI shielded, or both are in demand for optoelectronic packages where the optical and electronic modulation modules must be protected from dust and moisture. The solder alloys of the present invention find application in such packages. Other applications would be for defense, aerospace, and telecommunication electronics where stray RFI/EMI can diminish or destroy the package function. In these packages, metal and metal composite boxes house the electronics and, as in the other packages, removing the heat from the enclosures is important. Active solders that offer a hierarchy of low to higher melting temperatures are required for these applications. The low-temperature active solders of the present invention can join a range of materials that are being used or are emerging. In addition, no-flux active solder attach solves the issue of chemical fluxes entering into a sealed package where post-solder flux cleaning cannot be accomplished. In these sealed electronic and optoelectronic packages, the active solders of the present invention provide unique solutions over conventional solder and adhesive sealing.

The active solder compositions of the present invention can bond to the surface of semiconductor devices as well as all packaging materials without the use of fluxes or metal layers, and can do so with a resulting joint thickness less than that found in metallized-layer joining. An alternative is to use the active solder to produce a coating on the surface of the device and substrate, and then join the components with a non-active solder.

The use of active solder materials in joining semiconductor devices to their packaging allows for a higher performance thermal path from the device to the environment compared to conventional thermal interface materials. This advantage allows the device to operate at higher speeds, or allows devices with a greater density of components. The improvement in thermal performance results from either the increase in thermal conductivity that comes from replacing the organic polymer or grease filled with metal particles used for a thermal interface material, or by the reduction in the thickness of the connection between the device and the package. An additional benefit is a reduction in the cost and complexity of production: active solder joining requires fewer steps than metallization plus joining with conventional solders.

Within electronic packaging, the invention has focused on solder die attach in high-performance microprocessors. These are the very high speed Pentium IV chips, titanium class server chips, supercomputers, video processors, video games, and the like that cannot get remove all of the heat generated during operation using conventional packaging techniques. Lower performing parts tend to be built using a metal-filled polymer pad between the silicon die and the package lid to provide a thermal interface material ("TIM"), which creates a thermal conductance path (called "TIM1"), and use an array of pins pushed into a socket mounted on a circuit board. High-performance chips tend to be mounted directly to the circuit board by a grid of solder balls (BGA). This configuration improves the heat removal through the bottom of the part, because of all the metal connection, but exposes the part to a solder reflow cycle to allow attachment to the board. PGA chips do not see more than 125° C. during their thermal performance test because the socket is reflowed onto the board and the part inserted later. In the past, the reflow temperature was 185-190° C., but the new lead-free alloys mandated by Europe and Japan (and forcing the conversion of the whole industry to lead free) require a reflow temperature of about 260° C.

Conventional TIM1 materials have a thermal conductivity of about 5 W/m-K, with claims of up to 10 W/m-K for some new products. The thermal conductivity of the known active solder composition taught by Lugscheider et. al. (e.g., the Sn—Ag—Ti—Ga—Ce composition) is about 50 W/m-K, and pure indium is approximately 80 W/m-K. Thus, the provision of a solid metal path between the die and the lid would boost the heat transfer by about ten times. Interfacial resistance at the substrate bond lines and the thickness of the overall joint can reduce this difference substantially. The current "state of the art" is to metallize the backside of the die and the underside of the lid with multiple metal layers, typically Ti, Ni, then Au. The part is then joined with pure indium metal at approximately 175° C., perhaps with a no-clean flux but more commonly without flux. This can then survive the 125° C. of a PGA part.

One purpose of the low-temperature active solder of the present invention is to offer different ways to avoid premetallizing the die and lid. The whole bond can be made from active solder, or the active solder can be used as a coating on one or both surfaces and then the joint completed with active or conventional solders. The three specific compositions highlighted above (Bi—Sn, In—Sn, and In remainders) all join at or below the normal indium melt temperature and, therefore, will not expose the part to any higher a temperature than it was already designed to see. Indium-based solders are so expensive that, for all practical purposes, they are only useful in certain electronics markets. Bismuth-tin solders are sufficiently inexpensive to have application in other markets, such as bonding copper heat pipes to aluminum, but has significant competition from conventional tin-silver solders for ease of use.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges that fall within the broader ranges.

TABLE I

| Element/Group | Low Temp Active Sn—Bi Alloy | | Low Temp Active Sn—In Alloy | | Active In Alloy | |
|---|---|---|---|---|---|---|
| | Preferred | Range | Preferred | Range | Preferred | Range |
| Sn | Bal | Bal | Bal | Bal | 0 | 0 |
| In | 0 | 0-10 | 50.9 | 40-70 | Bal | Bal |
| Bi | 57 | 40-70 | 0 | 0-10 | 0 | 0 |
| Ti, Hf, Zr, etc | 2 | 0-10 | 2 | 0-10 | 0 | 0-10 |
| Ce, La, etc | 0.1 | 0.1-5.0 | 0.1 | 0.1-5.0 | 0.1 | 0.1-5.0 |
| Ga | 0.1 | 0.01-1.0 | 0.1 | 0.01-1.0 | 0.1 | 0.01-1.0 |
| Ag | 2 | 0-10 | 2 | 0-10 | 0 | 0-10 |
| Mg | 0.1 | 0-2 | 0.1 | 0-2 | 0.1 | 0-2 |
| | Temp Range | | Temp Range | | Temp Range | |
| | 139-141 C. | 130-170 C. | 118-122 C. | 110-160 C. | 155-160 C. | 150-170 C. |
| Methods | Full joint | | Full joint | | Full joint | |
| | Premetallization | | Premetallization | | Premetallization | |
| | Graded layers | | Graded layers | | Graded layers | |
| Applications | Electronic Pkg | | Electronic Pkg | | Electronic Pkg | |
| | Optical Pkgs | | Optical | | | |
| | Cold Plates | | Cold Plates | | | |
| | Heat Spreaders | | Heat Spreaders | | | |
| Components | BGA-Lid Attach | | Si Die | | PGA-Lid attach | |
| | Si Die | | GaAs Die | | Si Die | |
| | GaAs Die | | SiC Die | | GaAs Die | |
| | SiC Die | | Cu—W, Composite Lids | | SiC Die | |
| | Cu—W, Composite Lids | | | | Cu—W, Composite Lids | |
| Comments | ReFlow enabled | | | | | |

What is claimed:

1. An active solder alloy consisting essentially of:
   1% to about 10% by weight of an element or a mixture of elements selected from the group consisting of titanium, zirconium, hafnium, vanadium, niobium, or tantalum;
   between about 0.1 and 5% by weight of an element or a mixture of elements selected from the group of the lanthanides (rare earths);
   between about 0.01 and 1% by weight of gallium;
   between about 0.1 and 2% by weight of magnesium to enhance adhesion of the alloy to semiconductor device materials including silicon, gallium arsenide, and silicates; and
   a remainder consisting of tin, silver, and, optionally, bismuth, indium or both bismuth and indium.

2. The solder alloy of claim 1 comprising about 2% by weight of an element or a mixture of elements selected from the group consisting of titanium, zirconium, hafnium, vanadium, niobium, or tantalum.

3. The solder alloy of claim 1 comprising about 0.1% by weight of an element or a mixture of elements selected from the group of the lanthanides.

4. The solder alloy of claim 1 comprising about 0.1% by weight of gallium.

5. The solder alloy of claim 1 comprising about 2% by weight of silver.

6. The solder alloy of claim 1 comprising about 0.1% by weight of magnesium.

7. The solder alloy of claim 1 further comprising about 0.1% by weight of an element or a mixture of elements selected from the group of the lanthanides; about 0.1% by weight of gallium; and about 0.1% by weight of magnesium.

8. The solder alloy of claim 7 further comprising about 2% by weight of an element or a mixture of elements selected from the group consisting of titanium, zirconium, hafnium, vanadium, niobium, or tantalum and about 2% by weight of silver.

9. The solder alloy of claim 1 wherein the remainder comprises up to about 10% by weight of bismuth, between about 40 and 70% by weight of indium, and a balance of tin and silver.

10. The solder alloy of claim 9 wherein the remainder comprises about 51% by weight of indium.

* * * * *